United States Patent [19]

Muendel

[11] 4,178,603
[45] Dec. 11, 1979

[54] SCHOTTKY TRANSISTOR WITH LOW RESIDUAL VOLTAGE

[75] Inventor: Gerald Müendel, Glonn, Fed. Rep. of Germany

[73] Assignee: Siemens Aktiengesellschaft, Berlin & Munich, Fed. Rep. of Germany

[21] Appl. No.: 826,939

[22] Filed: Aug. 22, 1977

[30] Foreign Application Priority Data

Sep. 3, 1976 [DE] Fed. Rep. of Germany ....... 2639799

[51] Int. Cl.² ............................................ H01L 29/48
[52] U.S. Cl. ....................................... 357/15; 357/34; 357/35; 357/36; 357/51
[58] Field of Search ......................... 357/35, 36, 15, 51, 357/34

[56] References Cited

U.S. PATENT DOCUMENTS

| | | | |
|---|---|---|---|
| 3,506,893 | 4/1970 | Ohaka | 357/15 |
| 3,869,622 | 3/1975 | Shimizu | 357/15 |
| 3,943,554 | 3/1976 | Russell et al. | 357/15 |
| 3,967,307 | 6/1976 | Mueller et al. | 357/15 |
| 4,032,962 | 6/1977 | Balyoz et al. | 357/15 |
| 4,054,898 | 10/1977 | Streit et al. | 357/36 |

OTHER PUBLICATIONS

R. Knepper, "Reducing the Series Resistance of a Schottky Barrier Diode Clamp for a NPN Transistor," IBM Tech. Discl. Bull., vol. 17, #6, Nov. 1974, pp. 1609, 1610.

*Primary Examiner*—Joseph E. Clawson, Jr.
*Attorney, Agent, or Firm*—Hill, Van Santen, Steadman, Chiara & Simpson

[57] ABSTRACT

A planar transistor has its base-collector-pn-junction bridged with a Schottky diode, wherein the degree of coupling of the Schottky diode is modified by means of a semiconducting layer with non-homogenous doping.

9 Claims, 13 Drawing Figures

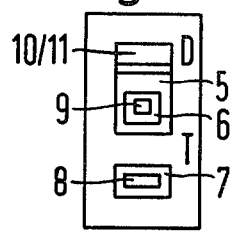
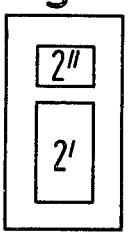
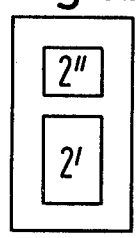
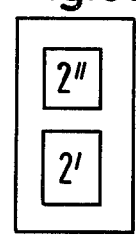
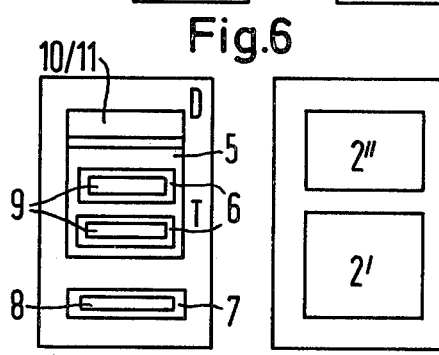
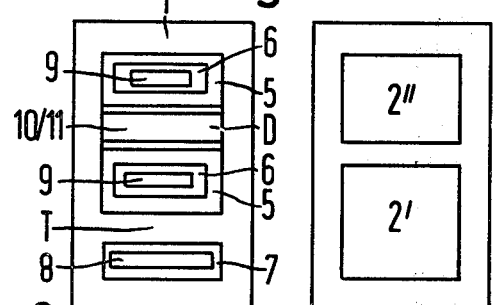
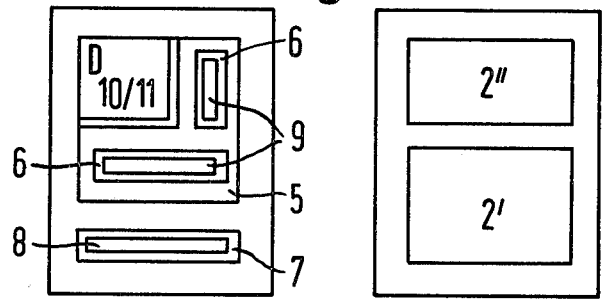
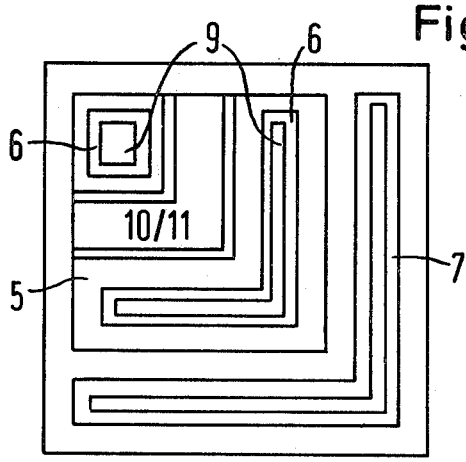
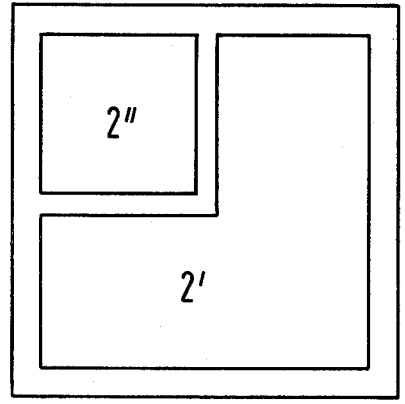

SCHOTTKY TRANSISTOR WITH LOW RESIDUAL VOLTAGE

BACKGROUND OF THE INVENTION

1. Field of the Invention

The present invention relates to Schottky transistors, and more particularly Schottky transistors which are adapted for non-saturating operation with relatively low residual voltages at high temperatures.

2. The Prior Art

A Schottky transistor is one in which a planar transistor is combined with a Schottky diode in a common semi-conductor crystal structure, so that the Schottky diode is internally coupled with the planar transistor, to reduced the tendency of the planar transistor to saturate.

According to the principle Baker, when a Schottky "clamp diode" is connected between the base and collector zone of the planar transistor, saturation of the transistor is avoided, and the switching time is made shorter. A Schottky diode is typically used since the diode should have a smaller forward voltage drop then the base-collector-pn-junction of the planar transistor. Unfortunately, because of the manner of construction of conventional Schottky transistors, the external residual voltage is increased. This is generally undesirable, because a large difference in voltage levels must be insured for the two operating states of the transistor. The greater residual voltage also tends to weaken the clamping effect of the Schottky diode, and tends toward a displacement of the operating point in the direction of saturation.

BRIEF DESCRIPTION OF THE INVENTION

It is the principle object of the present invention to eliminate the disadvantages just described.

Another object of the present invention is to provide a Schottky transistor structure in which reduced residual voltages are possible, and non-saturating operation is insured even at relatively high temperatures of operation.

These and other objects and advantages of the present invention will become manifest by an examination of the following description and accompanying drawings.

In one embodiment of the invention there is provided a planar transistor having a base-collector-pn-junction which is bridged with a Schottky diode, the degree of coupling between the Schottky diode and the base-collector-junction of the transistor being modified by heterogeneous doping.

BRIEF DESCRIPTION OF THE DRAWINGS

Reference will now be made to the accompanying drawings in which:

FIG. 5 thru FIG. 5c illustrate alternative embodiments of the present invention;

FIG. 6 and 7 illustrate embodiments of the present invention incorporating two emitter zones for the planar transistor;

FIGS. 8 and 9 illustrate two additional embodiments of the present invention.

DESCRIPTION OF THE PREFERRED EMBODIMENTS

Figure 1:
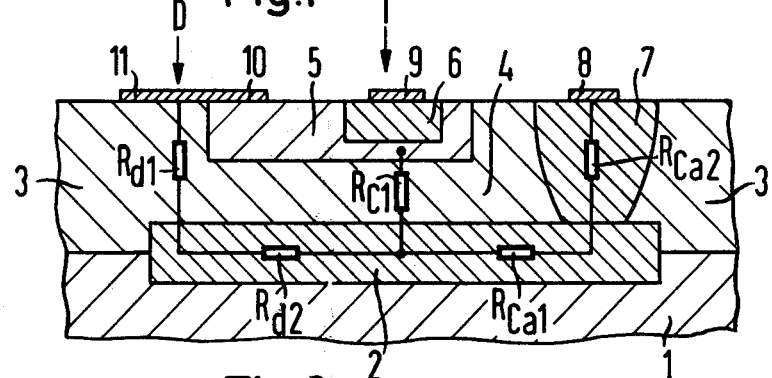
FIG. 1 is a cross-sectional view of the conventional Schottky transistor structure.

Before describing the preferred embodiments, the conventional Schottky transistor structure illustrated in FIG. 1 will be described.

On a substrate crystal 1, consisting of monocrystalline silicon, said substrate crystal being e.g. of the $p^{30}$-type, a surface region 2 of the $n++$-type is initially produced by means of diffusion or ion implantation. The surface region 2 is covered with an n-conductive epitaxial silicon layer 3 whose doping concentration is selected such that if forms the collector 4 of a planar transistor T. On the surface of the epitaxial silicon layer 3, the p-type base zone 5 of the transistor is produced in a conventional fashion by masked diffusion or ion implantation, and in the base zone, the emitter zone 6 (of the $n+$-type) is produced. In addition, an n-conductive collector-contacting channel 7 can be advanced to the buried zone 2, over which the main part of the collector current of the planar transistor T is conveyed via collector electrode 8. An emitter electrode 9 is provided for contacting the emitter zone 6, and a base electrode 10 is provided for contacting the base zone 5. The collector zone 3, 4 surrounds the base zone 5 in trough-like fashion, and the base zone similarly surrounds the emitter zone 6.

The base electrode 10 extends beyond the base-collector-junction and has a part 11 located at the border of the n-conductive silicon of the epitaxial layer 4 forming a Schottky contact to zone 3 or 4. The construction of the Schottky diode D provided by this Schottky contact is such that it lies in the non-conducting direction when the base-collector-pn-junction of the planar transistor is also blocked.

When transistor T is switched on, the entire actuating (or operating) current initially flows into base 5 of the transistor and causes the transistor to conduct. Prior to the occurrence of saturation, the largest portion of the operating current flows via the Schottky diode D to collector 4 of transistor T. On account of this, saturation is prevented and the transistor T is capable of being rapidly switched off.

Figure 2:
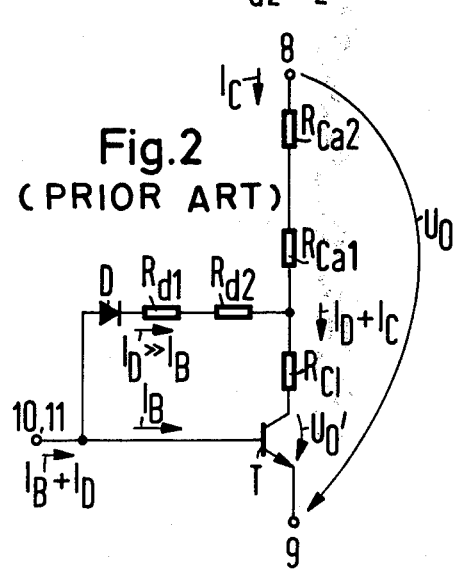
FIG. 2 is an equivalent circuit diagram of the structure of FIG. 1.
Figure 4:
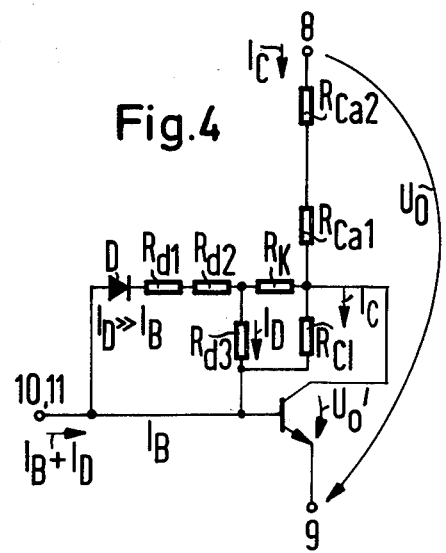
FIG. 4 is an equivalent circuit of the structure of FIG. 3.

The equivalent circuit diagram of the arrangement is illustrated in FIG. 2. The resistances indicated therein are also shown in FIG. 1. $I_B$ is the base current of the transistor T; $I_D$ is the current of the Schottky diode D; and $I_C$ is the collector current of the transistor T.

If the transistor T has a sufficiently large current amplification, the diode current $I_D$ is approximately equal to the input or operating current $I_B$ and $I_D$ subsequent to the switch-on operation. In order to realize very brief switching, the transistor must be kept in the overdrived state. The ratio of collector current $I_C$ to the operating current $I_B$ and $I_D$ lies in the range of 4:1 to 1:1.

Both $I_D$ as well as $I_C$ bring about a voltage drop at the internal collector resistance $R_{CI}$. As a consequence, the external residual voltage $U_o$ is increased, which is undesirable since generally $U_o$ works counter to base-emitter path of an output transistor, and a satisfactory difference in voltage levels must be ensured. A further disadvantage of the voltage drop at $R_{CI}$ is the weakening of the clamping effect of Schottky diode D, which brings about a drop in the internal residual voltage $U_o$ and consequently a displacement of the operating point in the direction of saturation.

Therefore, the value of the resistance $R_{C1}$ and the bulk resistance $R_d = R_{d1} + R_{d2}$ of Schottky diode D should be made as small as possible. This is achieved by adjusting e.g. the doping concentration in the epitaxial layer 4 and/or in the buried layer 2 to be as high as possible, or by making the overall thickness of the epitaxial layer 4 small, respectively, e.g. through the use of larger structures. However, through larger areas and an increased doping, the junction capacitances and thus the switching time are enlarged. Moreover, in utilizing thin epitaxial layers 4, the yield of satisfactory devices decreases on account of the low tolerances.

Figure 3:
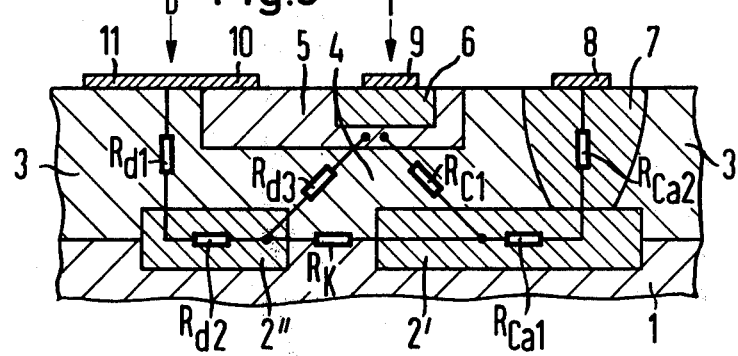
FIG. 3 is a cross-sectional diagram of a semi-conductor structure incorporating an illustrative embodiment of the present invention.

In a Schottky transistor arrangement according to the invention as shown in FIG. 3, the coupling between the Schottky diode and the collector current circuit is reduced, said coupling being conditioned by the collector bulk resistance. For this purpose, buried zone 2 of the conventional construction illustrated in FIG. 1 is subdivided into two sections 2' and 2" whereby the one of these two sections, section 2', is in direct connection with the collector contacting channel 7, and the section 2", which is more closely adjacent the Schottky diode D, is maintained without connection to the collector contacting channel 7. Preferably, this section 2" is constructed as a so-called floating or contactless, zone.

The placement of the interruption zone between the two sections of the buried zone 2 is the result of the consideration that the greater portion of collector current $I_C$ is to be collected by the section 2' contacted with collector electrode 8, with the Schottky diode also exercising its function. The width of the interruption point between the two sections 2' and 2" of buried zone 2 determines, among other things, the magnitude of the coupling resistance $R_k$, and is to be adjusted such that $R_k = p \cdot (R_{d3} + R_{C1})$, where the factor p is in the range of 1 to 10. The section 2' of the buried zone has the function of keeping the value of the bulk resistance $R_{d2}$ for the current of Schottky diode D small.

The coupling of the current circuits for $I_D$ and $I_C$, which is strongly reduced in comparison with the conventional Schottky-transistor arrangement according to FIG. 1, is determined by the width of the interruption zone; i.e., the specific resistance of the semiconductor material at the interruption zone. Since the epitaxial layer 3, and thus also the collector zone 4 of transistor T, is adjusted to be substantially more highly resistive than the sections 2' and 2" of buried layer 2, a narrow interruption zone having approximately a width of s to 3 s suffices, whereby s denotes the thickness of the buried zone 2', or 2". The position of the interruption zone (for example, closer to the collector contacting channel 7 or closer to the Schottky diode D) influences the resistances $R_{CI}$, or $R_{d3}$, and thus the residual voltage $U_o$ and the switching speed of the transistor.

During weak operation $(I_B + I_D < < I_C)$; i.e., at low switching speeds, the value of resistance $R_{C1}$ is somewhat enlarged by means of the interruption zone between the two parts 2' and 2" of buried zone 2. This increased value of resistance $R_{C1}$ manifest itself in a somewhat increased value of the residual voltage $U_o$.

However, if there is a strong driving signal $(I_B + I_D < < I_C)$, the arrangement according to the invention delivers a smaller residual voltage than the conventional embodiment according to FIG. 1, which is otherwise structurally the dimensional equivalent, since current $I_D$ supplies almost no contribution to the residual voltage. Moreover, the transistor is faster since current $I_C$ does not weaken the clamping effect of Schottky diode D as greatly as the conventional arrangement.

The reduced residual voltage of the arrangement of this invention permits the use of smaller transistor structures which, in turn, leads to an increase in the speed and to a higher packing density.

With low temperatures; i.e., of approximately 0° to 25° C., in the case of Schottky transistor arrangements, the increasing residual voltage $U_o'$ is the decisive limit for the operating range; with higher temperatures; i.e., of approximately 25° to 70° C., the tendency toward saturation is the decisive limit for the operating range. Accordingly, a rapid Schottky transistor with small residual voltage according to the invention will also make possible an operation in a larger temperature range than the conventional structures.

In FIGS. 5, 5a, 5b, and 5c the interruption zone in the buried layer 2 is shown at three different places. These figures show Schottky-transistor for small structures; i.e., arrangements with approximately 10-40 μm emitter length. The figures represent the arrangements from above; i.e., viewed from above epitaxial layer 3. FIG. 5 shows the arrangement of the collector electrode 8, the emitter electrode 9, the combined base Schottky contact 10, 11, the base zone 5, the emitter zone 6, and the collector connection channel 7. FIGS. 5a-5c show different interruption zone locations for the arrangement illustrated in FIG. 5.

If the arrangement is to exhibit an extremely low residual voltage $U_o$, the interruption zone between the two sections 2' and 2" of the buried zone are to be arranged approximately in the manner apparent from FIG. 5a between the projection of emitter zone 6 and projection of the combined base-Schottky electrode 10/11 on the plane of buried zone 2. If the requirement for a lower residual voltage is less important, the interruption zone between the two zones 2' and 2" will be displaced in the direction of the Schottky diode D to a somewhat lesser extent than in the case of FIG. 5a, and the approximate "midposition" apparent from FIG. 5b will be employed, which leads to a fast switching Schottky-transistor, in comparison to the known arrangement of FIG. 1, with a small residual voltage. If, however, the switching speed is to be increased to a particularly great extent, the interruption zone will be moved even further away from Schottky diode D. In each case the external edges of the two sections 2' and 2" are unchanged in the three arrangements shown in FIGS. 5a, 5b, and 5c.

The making of the interruption zone of the buried layer is possible in various ways. First the buried zone 2 may be produced in two parts from the very start by means of masked diffusion of dopants on the surface of the substrate 1. It is also possible to replace masked diffusion with masked implantation; for example, in utilizing implantation masks consisting of $Si_3N_4$. Subsequently, the epitaxial layer 3 is deposited, the base zone 5 and the emitter zone 6 being formed according to method conventional technique.

Another method provides for the production of the buried zone 2 initially in a connected form which is, subsequent to the deposition of the epitaxial layer 3, entirely or partially divided up into the two sections 2' and 2" through measures which are carried out from the back-side of the substrate. For example, it is possible, by means of photosensitive resist technology, to advance an indentation or recess from the rear- or under-side of substrate 1 to the buried layer, and, in this manner, to achieve a partial or preferably complete, subdivision of this layer into the two sections 2' and 2".

Ion implantation may also be used for this purpose. In this case one proceeds from the rear- or under-side of the substrate 1 (i.e., the side opposite the epitaxial layer 3) and one of the following two procedures is carried out:

(a) producing a highly resistive interruption zone in an already-present buried zone 2 by means of localized implantation of doping ions producing a conductivity opposite that of the buried zone 2.

(b) producing the buried zone 2 from the very start in the form of two separate parts 2' and 2", by means of a corresponding injection of ions determining the conductivity of the buried layer.

Since the penetration stage (or degree) of the ions is primarily determined by their kinetic energy, controlled by the accelerating electric field the two procedures described above may also be readily carried out from the underside of the substrate 1 even after the application of the epitaxial layer 3.

This provides the possibility of producing the two parts of the buried zone at the very close of the manufacture process; i.e., after the production of zones 5, 6, 7, and of contacts 8, 9, 10/11, since the zones of transistor T produced in the epitaxial layer 3 are not affected by the implantation operations conducted from the under side of the substrate plate, and a thermal treatment for the purpose of curing the crystal defects resulting as a consequence of the implantation is either not necessary at all or is of only very short duration, so that the electric properties produced by the doping of zones 4, 5, and 6 of the planar transistor T do not subsequently undergo any deterioration due to this implantation operation.

In the case of larger structures than those shown in FIGS. 5–5c, there is the possibility of applying two or more emitter zones 6. The interruption of the buried layer 2 in such a case brings about an even greater decoupling than is possible in the case of small structures. FIGS. 6 and 7 illustrate two arrangements with two emitter zones. The arrangements are again illustrated from above, viewed in the direction of the epitaxial layer. In the arrangement according to FIG. 6 the left half shows the arrangement of the zones on the upper side of the epitaxial layer 3, and the right half shows the arrangements of both parts of the buried zone 2 in relation to the zones of transistor T and the Schottky diode D. In FIG. 6, both emitter zones of transistor T as well as the collector connection 8 are located on the same side of Schottky diode D. In the arrangement according to FIG. 7, the two emitters of transistor T are arranged on opposite sides of the Schottky diode.

Additional advantageous embodiments are illustrated in FIGS. 8 and 9 in each of which the left half likewise shows the arrangement of the emitter zones and the base zone in relation to the combined Schottky base contact 10/11, and the right half illustrates the arrangement of both parts of the buried layer.

A transistor constructed in accordance with FIG. 3 has been compared with a similar transistor constructed according to FIG. 1. Both transistors had the same dimensions and dopant concentration, and were selected as follows:

Substrate 1: $p^+$-conductive, specific resistance 8$\Omega$ cm.

Epi-layer 3 and collector 4: n-conductive; specific resistance 0.3$\Omega$ cm.

Base zone 5; p-conductive, layer resistance 230$\Omega$ per square.

Emitter zone 6; $n^+$-conductive, layer resistance 7.5$\Omega$ per square.

Buried zones 2', 2", layer resistance 30$\Omega$ per square.

Emitter length 9 i.e., the length of the edge of the emitter zone 6 which is facing the Schottky contact) 21 $\mu$m.

Area of the contact section 11 of the combined Schottky-base contact, 240 $\mu m^2$.

The width of the interruption zone of the buried layer 2 was approximately 12 $\mu$m. Moreover, the originally adjusted width of the interruption zone has been reduced by the diffusion of dopant out from the sections 2' and 2", which diffusion is connected with the epitaxial production of layer 3, as well as by the heating brought about by subsequent doping processes so that a coupling resistance $R_k$ of approximately 150 Ohm resulted in the transistor constructed according to FIG. 3. It is negligible in the case of the conventional transistor arrangement according to FIG. 1. The arrangement of the interruption zone in the buried layer 2 was, in addition, selected according to the principles of FIG. 5b. The following significant properties resulted from the above-indicated values:

Conventional Schottkey transistor according to FIG. 1:

Given a ratio of actuating current to collector current of $(I_B+I_D/I_C)=1.9$ to 0.78, the residual voltage $U_o$ amounts to 254 mV to 340 mV. The measurement of switching speed in the case of a 3-stage inverter results in the value 14 ns.

Novel Schottky transistor according to FIG. 3:

Under the same conditions, $U_o$ is 167 mV to 362 mV and the switching speed is 11.3 ns.

The surface of the transistors, aside from the contact points, is covered in a conventional fashion with a layer consisting of an inorganic insulating material. Contacts 8 and 9 consists of aluminum and are constructed so as to be barrier-free. The combined base-Schottky-contact 10/11 may also consist of aluminum, whereby, during application, precautionary measures must be taken to insure that a rectifying connection; i.e., a Schottky contact results between epitaxial layer 3, or collector zone 4, and electrode 11. Details of manufacture are known to those skilled in the art and will not be described in detail here.

The planar transistor T may be constructed in the form of a pnp-transistor. In this case, the buried zone becomes $p^{30}$-conductive, and the Schottky contact is to be selected such that it results in a rectifying connection to the p-conductive collector zone of planar transistor T, whereas the n-conductive base zone would have to be contacted in a barrier-free fashion. This requirement is met by aluminum as the material for the Schottky-base contact 10/11. Finally, the use of other semiconductor materials, such as silicon; for example, GaAs, is also possible.

Figure 10:
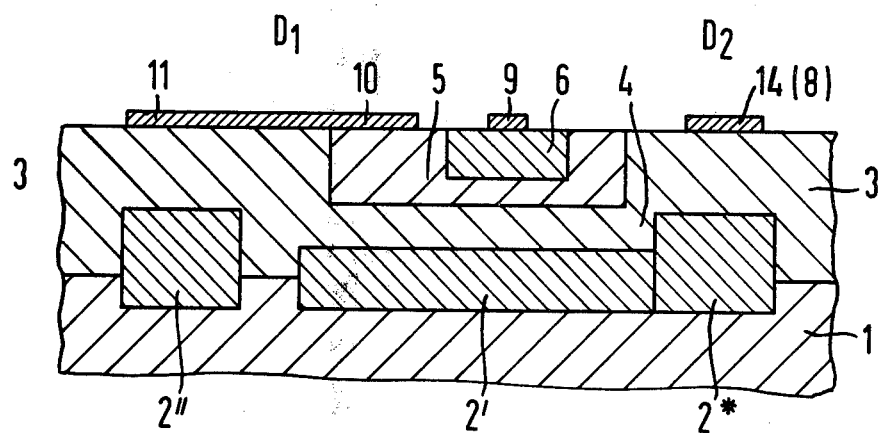
FIG. 10 is an illustration of an alternative construction of the present invention having two separate Schottky diodes.

The arrangement illustrated in FIG. 10 provides two Schottky diodes $D_1$ and $D_2$ for the purpose of loading a planar transistor T. The first of these diodes $D_1$, in a manner analogous to the arrangement of FIG. 3, forms a Schottky transistor with the planar transistor T. The second Schottky diode $D_2$ has the function of contacting the collector 4 of the Schottky transistor T. For this reason, the degree of coupling between the collector bulk resistance and the first Schottky diode $D_1$ is reduced, and the degree of coupling between the collector bulk resistance and the second Schottky diode $D_2$ is increased. A buried layer 2 consisting of three parts is provided between the p-conductive substrate 1 and the n-conductive epitaxial layer 3. For the purpose of decoupling, as in the case of FIG. 3, the section 2" of the buried layer 2 is located beneath the combined Schottky-base contact 10/11, and is completely removed from the other two interconnected sections 2' and 2* of this layer, and the width of the interruption zone is dimensioned in accordance with the principles described above. The section 2* of the buried layer 2, which is arranged beneath the second Schottky diode $D_2$, however, has an electric conductivity which is substantially greater than the two sections 2' and 2" of buried layer 2. In an exemplary case, this conductivity is of the $n^{++}$-type. The Schottky contact 14 of the second Schottky diode is selected so that it simultaneously carries out the function of the collector electrode 8. The advantages of the arrangement of FIG. 10 is that the residual voltage is reduced, permitting a smaller structure of a Schottky transistor, and the collector is decoupled via a Schottky diode permitting greater switching speed. The application is particularly advantageous for very fast switching circuits, in which, in order to achieve high signal speeds, operation is carried on with very small differences between the voltage levels for the two switching states. For example, with a voltage level equal to the base-emitter forward voltage of a Schottky transistor for the high-level, and the residual voltage of a Schottky transistor with its collector decoupled by a Schottky diode as the low-level.

The implantation technique for forming the interruption zone, particularly when carried out from the underside of the substrate, permits the buried layer 2 to be brought closer to the surface of the epitaxial layer 3 beneath the Schottky contacts than beneath the transistor T, tending to reduce the corresponding bulk resistances.

I claim as my invention:

1. In a transistor structure having a planar transistor and a Schottky diode combined in a common semiconductor crystal, said transistor having base, emitter and collector zones, and said Schottky diode being connected between said base and collector zones by means of a doped buried layer zone, the improvement comprising said buried layer zone having a pair of doped regions of one conductivity separated by a region of lesser conductivity to reduce the coupling between the diode and the transistor.

2. In a transistor structure having a planar transistor and a Schottky diode combined in a common semiconductor crystal such that the Schottky diode, through internal coupling in the semiconductor crystal, markedly influences the electric behavior of the planar transistor, the improvement comprising a doped layer for effecting coupling between the Schottky diode and the planar transistor having contiguous regions of different doping levels to produce a modified degree of coupling between the diode and the transistor as compared with a structure having a homogeneously doped coupling layer, said planar transistor being constructed such that the collector zone surrounds the base zone in a trough-like fashion, and including a contact for the Schottky diode which simultaneously forms a blockage-free base electrode at the surface of the base zone, the degree of coupling between the collector bulk resistance of the planar transistor and the Schottky diode being reduced by a zone with an increased specific resistance in said doped layer, the zones of said transistor being produced in a semiconductor layer epitaxially grown on a monocrystalline substrate, said semiconductor layer being, in particular, a monocrystalline silicon layer, said doped layer consisting of two sections separated by an interruption zone, said doped layer being located between the substrate and the epitaxial layer, said doped layer exhibiting the conductivity of the collector zone of the planar transistor and arranged with one section located beneath the base zone and the other located beneath the combined base-Schottky contact, both of said sections manifesting a greater specific electric conductivity than the collector zone, said collector zone being contacted by said one section, at the side of the base zone opposite from the Schottky diode said other section extends beyond the base zone, and including a Schottky contact provided above said extension, said contact forming, with the material of the epitaxial layer, a second Schottky diode electrically connected with said other section.

3. The transistor structure according to claim 2, wherein said one section is constructed to increase the degree of coupling between said second Schottky diode and said planar transistor.

4. The transistor structure according to claim 3, characterized in said extension manifests a higher electric conductivity.

5. In a transistor structure having a planar transistor having base, emitter and collector zones and a Schottky diode adjacent thereto combined in a common semiconductor crystal, said Schottky diode comprising a metalized layer juxtaposed with the base zone of said transistor, said metalized layer forming a blocking-free contact with the base zone of said planar transistor and forming a Schottky contact with its collector zone, the improvement comprising a first buried layer zone located adjacent and below said collector zone and doped more heavily than the collector zone with the same doping conductivity, said buried layer zone being juxtaposed with said planar transistor at a side thereof remote from said Schottky diode, said buried layer being continuous with a conducting channel leading to a connecting electrode at the semiconductor surface, said conducting channel being doped approximately the same as said buried zone, a second buried layer zone located adjacent the bottom of said collector zone below said Schottky diode, said second buried layer zone being produced simultaneously with said first buried layer zone, and a separating region doped approximately the same as said collector zone separating said first and second buried layer zones.

6. The transistor structure according to claim 5, wherein said planar transistor is constructed such that the collector zone surrounds the base zone in a trough-like fashion, the degree of coupling between the collector bulk resistance of planar transistor and the Schottky diode being reduced by said separating region.

7. The transistor structure according to claim 6, wherein the zones of said transistor are produced in a semiconductor layer epitaxially grown on a monocrystalline substrate, said semiconductor layer being, in particular, a monocrystalline silicon layer, said first and second buried layer zones being located between the substrate and the epitaxial layer, said layer zones exhibiting the conductivity of the collector zone.

8. The transistor structure according to claim 5, wherein said channel runs transversely through the epitaxial layer, said channel having a high electric conductivity and being of the conductivity type of the collector zone to provide a conductive connection between said one section, and said connecting electrode comprising a collector electrode forming a blockage-free contact at the surface of the epitaxial layer.

9. The transistor structure according to claim 5, wherein one of said buried layer zones is closer to the surface of the epitaxial layer than said other section.

* * * * *